United States Patent
Harima

[11] Patent Number: 5,805,018
[45] Date of Patent: Sep. 8, 1998

[54] HIGH-SPEED DEMODULATING METHOD OF BURST DATA AND APPARATUS FOR SAME

[75] Inventor: Yousuke Harima, Tokyo, Japan

[73] Assignee: Ando Electric Co., Ltd., Tokyo, Japan

[21] Appl. No.: 856,208

[22] Filed: May 14, 1997

[30] Foreign Application Priority Data

May 31, 1996 [JP] Japan ................................. 8-160977

[51] Int. Cl.$^6$ .............................. H03D 3/00; H04L 27/22
[52] U.S. Cl. .......................... 329/304; 329/310; 375/328; 375/329
[58] Field of Search .................... 329/304–310; 375/324, 328–333

[56] References Cited

U.S. PATENT DOCUMENTS 5,440,265  8/1995  Cochran et al. ................. 329/304 X Primary Examiner—David Mis
Attorney, Agent, or Firm—Flynn, Thiel, Boutell & Tanis, P.C.

[57] ABSTRACT

A high-speed demodulating method of burst data capable of performing demodulation process at high speed in a single hardware structure. An input signal digitally modulated is taken in into an input unit to be sampled and latched therein by a sampling clock from a controller, and a modulation signal from the input unit is taken in into either a first demodulator or a second demodulator for each one burst data depending on the timing of a first control signal or a second control signal output by the controller, respectively, and demodulated, and a first demodulation signal produced from the first demodulator or a second demodulation signal produced from the second demodulator is taken in into an output unit by a third control signal output by the controller, and in the output unit, the first demodulation signal or the second demodulation signal is latched by a latch signal of the controller and supplied as an output signal.

4 Claims, 8 Drawing Sheets

HIGH-SPEED DEMODULATING METHOD OF BURST DATA AND APPARATUS FOR SAME

BACKGROUND OF THE INVENTION

1. Field of the Invention

The present invention relates to a high-speed demodulating method of burst data, whereby burst signals in which a high-speed data train is modulated by means of a digital modulation system such as the π/4 shift QPSK (quadrature phase shift keying), GMSK (Gaussian filtered minimum shift keying), or 16 QAM (quadrature amplitude modulation) are demodulated by a plurality of demodulators for each burst, and an apparatus of the same.

2. Description of the Related Art

FIG. 5 is a block diagram showing a construction of a burst data demodulator in which a conventional burst data demodulating method is applied. In FIG. 5, an input signal 24 is taken in into an input unit 21 by a burst data latch timing signal 28 supplied by a demodulator 22.

The input unit 21 converts the input signal 24 taken therein into a modulation signal 25, which is input to the demodulator 22.

The demodulator 22 demodulates the modulation signal 25 into a demodulation signal 26, which is supplied to an output unit 23.

The demodulator 22 further supplies a demodulated data latch signal 29 and the foregoing burst data latch timing signal 28 which are synchronized with the demodulation signal 26.

The foregoing demodulation signal 26 is input to the output unit 23, which outputs an output signal 27 synchronous with the timing of the demodulated data latch signal 29.

Next, the operational principle of these units will be described. The input unit 21 is formed as shown in FIG. 6, in which the input unit 21 is designed such that an analog to digital (A/D) converter 31 and a latch 32 are cascaded. The input signal 24 of the intermediate frequency range is input to the A/D converter 31 to be converted into a digital signal 33. The digital signal 33 is latched in the latch 32 synchronously with the burst data latch timing signal 28 supplied by the demodulator 22 shown in FIG. 5, and the latch 32 supplies the modulation signal 25.

Next, the demodulator 22 will be described. The demodulator 22 is formed as shown in FIG. 7. The modulator 22 is composed of a DSP (digital signal processor) 41. The modulation signal 25 is demodulated by a demodulation program executed on the DSP 41, and the DSP 41 outputs the demodulation signal 26.

The DSP 41 detects a timing of the burst signal input to produce the burst data latch timing signal 28 and the demodulated data latch signal 29.

FIG. 8 shows a flow chart of the demodulation program executed on the DSP 41. When the modulation signal 25 is input to the DSP 41 of the demodulator 22, a process 81 in FIG. 8 samples the input signal and takes in the data. Next, a process 82 executes a quasi-synchronous detection.

Next, a process 83 detects a sampling timing. A process 84 converts the input data into a phase data, a process 85 converts the input data into a demodulation data, and finally a process 86 outputs a demodulated data.

When detecting the sampling timing, the process 83 further produces the burst data latch timing signal 28, and the process 86 produces the demodulated data latch signal 29 when supplying the demodulated data.

Next, the output unit 23 will be described with reference to FIG. 9. As shown in FIG. 9, the output unit 23 is composed of a shift register 51.

The shift register 51 receives the demodulation signal 26 of a parallel data structure from the DSP 41 of the demodulator 22, and the demodulation signal 26 is latched by the shift register 51 and converted into the output signal 27 of a serial data structure by the demodulated data latch signal 29.

FIG. 10 shows a timing chart of a demodulation process in the conventional demodulator shown in FIG. 5, when taking up the PHS (personal handy phone system) as an example.

The burst interval of the PHS is 5 ms, the length of one burst is 625 ms, the transmission speed is 384 kbps, and the bit number of one slot is 220 bits.

The input signal 24 is a burst wave. The input unit 21 takes in the burst wave at the timing when the burst data latch timing signal 28 goes "H", which is demodulated in the demodulator 22. It takes about 8 ms as shown in FIG. 10 to demodulate one burst wave in case a DSP 56002 is used for the DSP process.

Consequently, the process time exceeds the burst interval, and the subsequent burst wave cannot be taken in. Thus, the conventional demodulator cannot demodulate the entire data.

One technique to reduce the process time within 5 ms is to review the algorithm and replace the DSP with one having a higher processing speed.

However, where a still higher speed such as a higher bit rate or a shorter burst interval is required, it is difficult for the conventional system to solve the problem.

SUMMARY OF THE INVENTION

According to a high-speed demodulating method of burst data of the present invention, an input signal 16 digitally modulated is taken in into an input unit 21 to be sampled and latched therein by a sampling clock 1G from a controller 15.

A modulation signal 17 from the input unit 21 is taken into either a first demodulator 22 or a second demodulator 13 for each one burst data depending on the timing of a first control signal 1B or a second control signal 1C output by the controller 15, respectively, and demodulated by the control of the controller 15. Thus, a first demodulation signal 18 and a second demodulation signal 19 are produced.

The first demodulation signal 18 and the second demodulation signal 19 are taken in into an output unit 14 by a third control signal 1D output by the controller 15, and in the output unit 14, the first demodulation signal 18 or the second demodulation signal 19 is latched by the control of the controller 15 and supplied as an output signal 1A.

According to a high-speed demodulating apparatus of burst data of the present invention, an input unit 21 takes in an input signal 16 digitally modulated and samples by means of a sampling clock 1G from a controller 15 and latches the input signal 16.

A modulation signal 17 is taken in into a first demodulator 22 or a second demodulator 13 for each one burst data by a burst timing control of the controller 15 and by a first control signal 1B or a second control signal 1C from the controller 15, respectively.

The first demodulation signal 18 or the second demodulation signal 19 demodulated by the first demodulator 22 or the second demodulator 13 is taken in into an output unit 14 by a third control signal 1D output by the controller 15, and latched in the output unit 14 by the control of the controller 15 and the output unit 14 supplies an output signal 1A.

DESCRIPTION OF THE PREFERRED EMBODIMENT

One embodiment of a high-speed demodulating method of burst data according to the invention and an apparatus of the same will hereafter be described with reference to the accompanying drawings.

Figure 1:
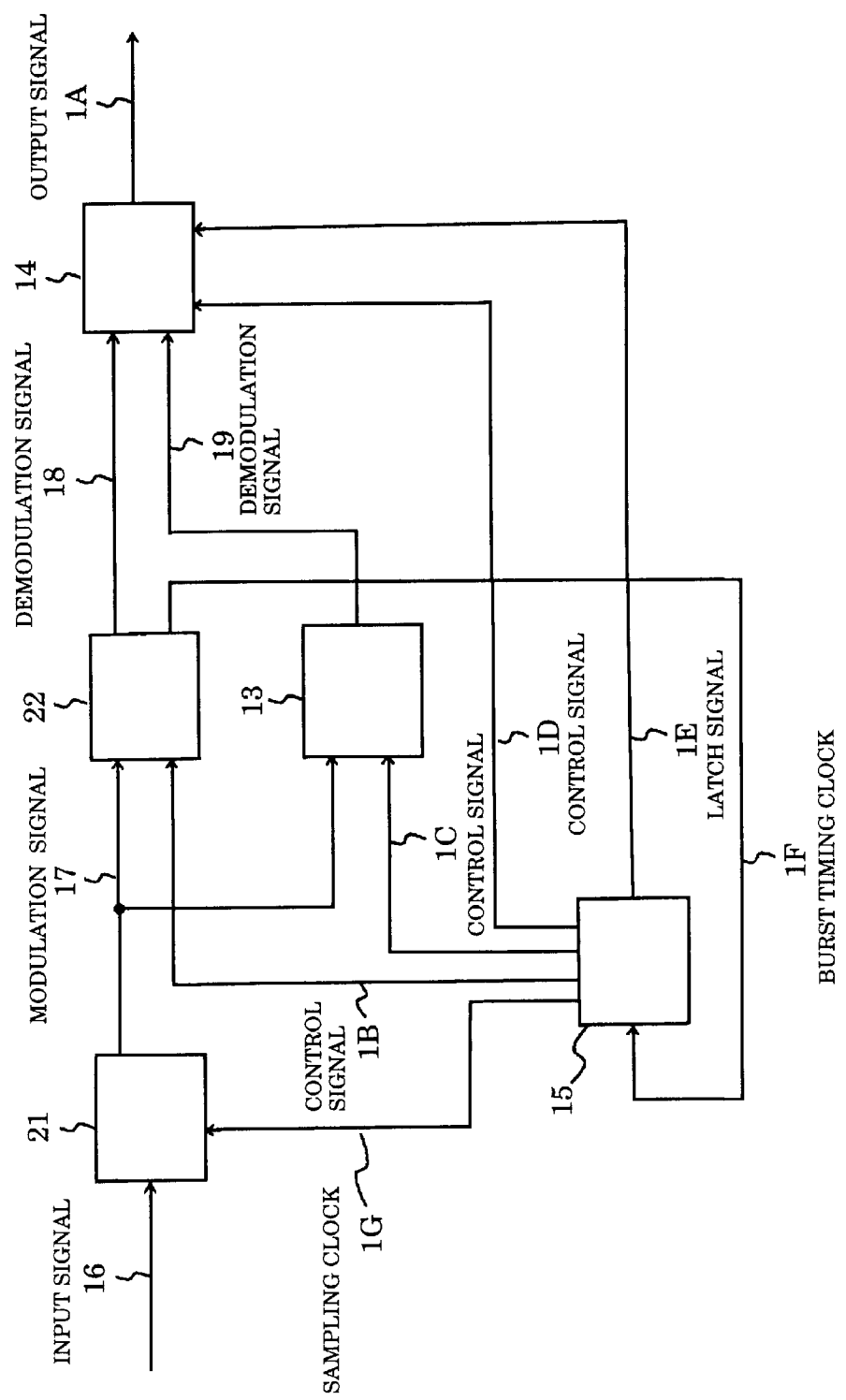
FIG. 1 is a block diagram showing a construction of one embodiment of a high-speed demodulating apparatus of burst data according to the invention.
Figure 5:
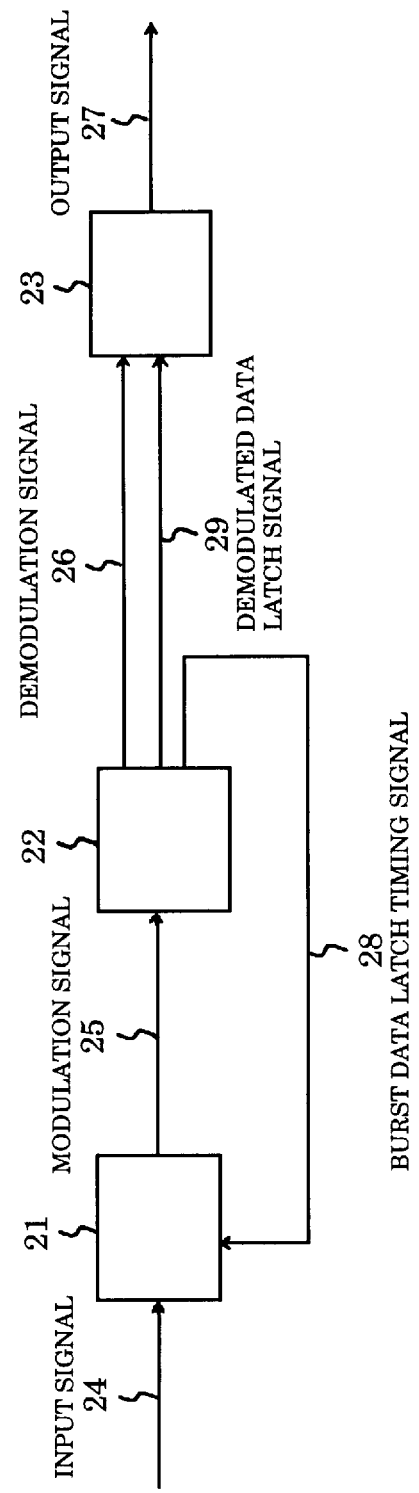
FIG. 5 is a block diagram showing a construction of a conventional demodulator of burst data.

FIG. 1 is a block diagram showing the whole construction of the one embodiment of a high-speed demodulating apparatus of burst data according to the invention. The input unit 21 and the first demodulator 22 shown in FIG. 1 are the same as the input unit 21 and the demodulator 22 (composed of a DSP) in the conventional example shown in FIG. 5. However, in this embodiment, the second demodulator 13 and the controller 15 are newly added.

Figure 6:
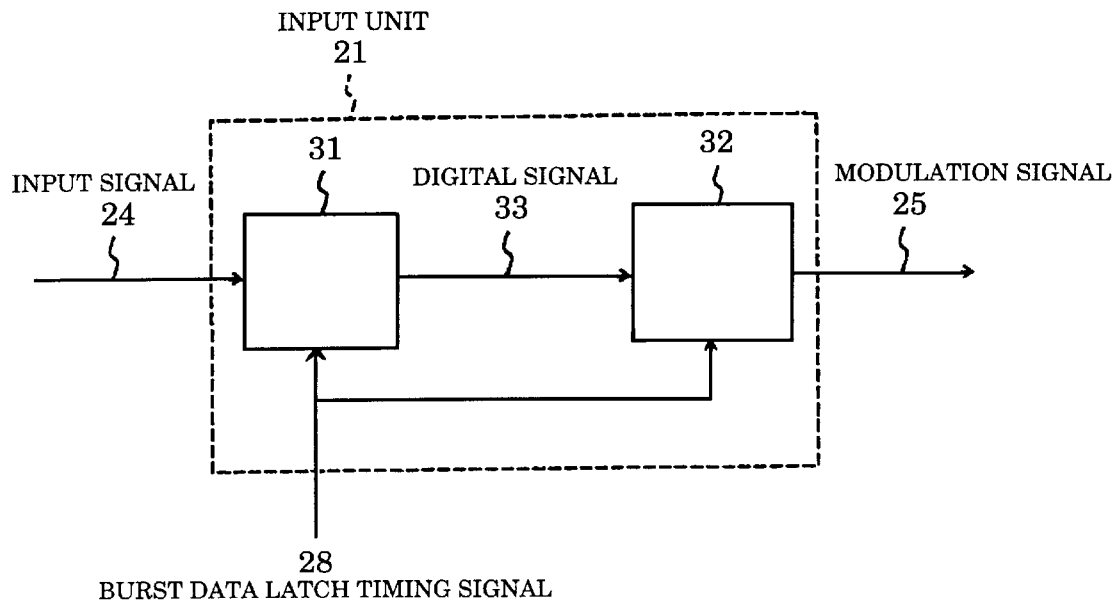
FIG. 6 is a block diagram showing an internal construction of the input unit in the demodulator of burst data in FIG. 5.

The circuit construction of the input unit 21 is the same as the one in the conventional example shown in FIG. 6. The burst data latch timing signal 28 input into the A/D converter 31 and the latch 32 in FIG. 6 is replaced with the sampling clock 1G in this embodiment which the controller 15 outputs to the input unit 21.

The controller 15 detects a burst timing means of a burst timing clock 1F supplied by the demodulator 22, and outputs the control signal 1B, 1C, 1D, latch signal 1E, and sampling clock 1G.

The input signal 16 is sampled by the sampling clock 1G in the A/D converter 31 in the input unit 21. The sampled input signal is latched in the latch 32 to be delivered to the demodulator 22 or the demodulator 13 as the modulation signal 17.

Each of the demodulator 22 and the demodulator 13 takes in the modulation signal 17 depending on the timing of the control signal 1B or 1C from the controller 15. The modulation signal 17 taken in at that moment is input to either the modulator 22 or the modulator 13 as determined by the control signal 1B or 1C.

The modulation signal 17 is converted in the demodulator 22 or the demodulator 13 into the demodulation signal 18 or demodulation signal 19, respectively.

The output unit 14 takes in the demodulation signal 18 or the demodulation signal 19 by the control signal 1D from the controller 15, latches the modulation signal by the latch signal 1E, and supplies the latched demodulation signal as the output signal 1A.

The number of the foregoing demodulators required is determined in accordance with the process time for one DSP and the burst interval, as expressed in the following equation (1).

$$\text{Number of demodulators} = (\text{process time for one DSP})/(\text{burst interval}) \quad (1)$$

In case of the PHS, the process time for one DSP is 8 ms, the burst interval is 5 ms, and therefore, two demodulators are needed.

Figure 7:
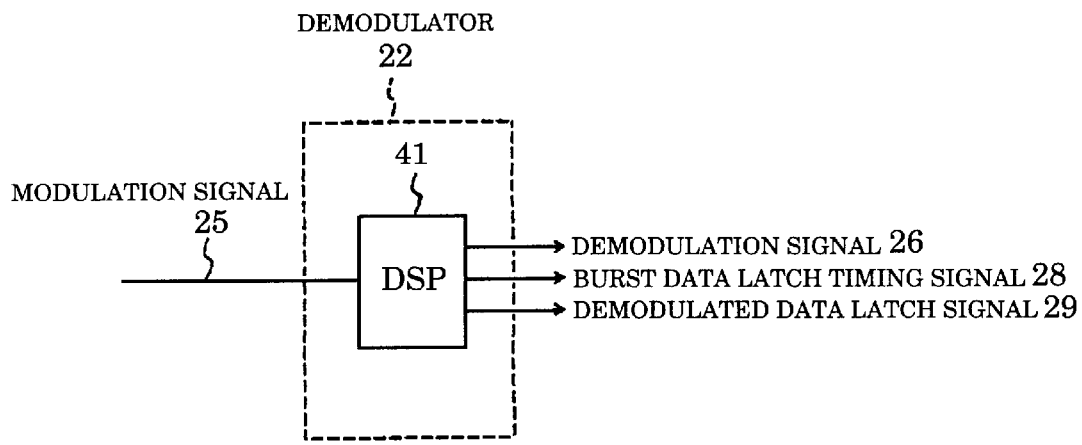
FIG. 7 is a block diagram showing an internal construction of the demodulating unit in the demodulator of burst data in FIG. 5.
Figure 8:
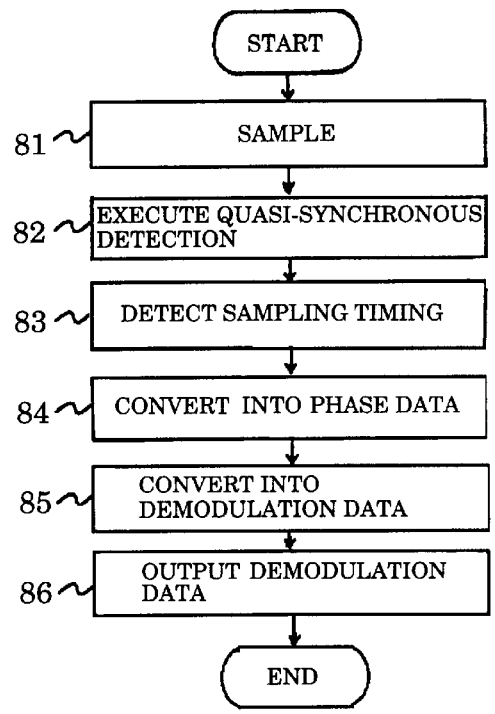
FIG. 8 is a flow chart showing a processing procedure of a demodulation program in which a conventional demodulation method of burst data is applied.
Figure 9:
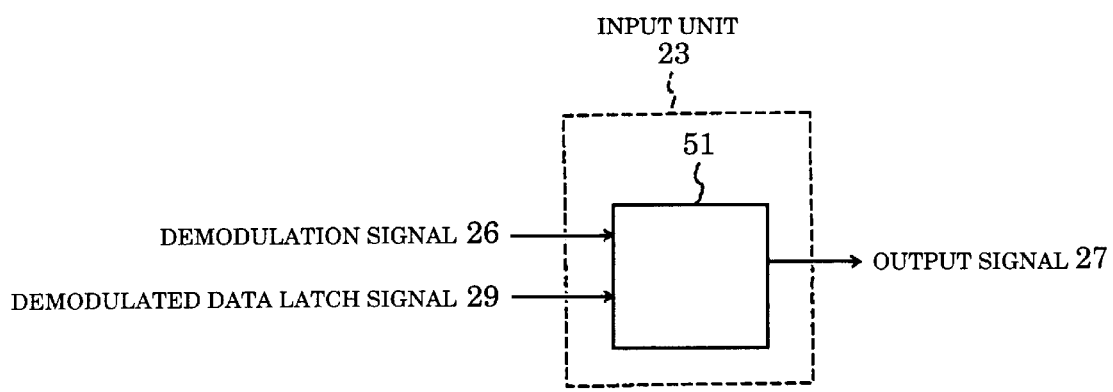
FIG. 9 is a block diagram showing an internal construction of the output unit in the demodulator of burst data in FIG. 5.

The circuit construction of the demodulator 22 is the same as the one in FIG. 7. However, in this embodiment, only the burst timing clock 1F is produced as the control signal to be supplied to the controller 15. Further, the demodulation signal 18 is the same as the demodulation signal 26 obtained in FIG. 7.

Next, the circuit configuration of the controller 15 will be described with reference to FIG. 3. In the controller 15, a reference clock generator 91 generates a reference clock, which is input to a frequency divider 92 to divide the frequency of the reference clock and to generate the sampling clock 1G, a DSP clock 1H, and a counter clock.

The sampling clock 1G is sent out to the input unit 21 as described above, and it serves as a sampling clock for the A/D converter 31 in the input unit 21. Generally, a sampling clock frequency is required to be two to three times higher than the intermediate frequency from the reproducibility of waveforms.

The sampling clock frequency is designed to be 10 MHz equivalent to 4 times of the intermediate frequency 2.5 MHz from the reproducibility of sine waves and the processing speed in this embodiment.

The DSP clock 1H is an operational clock for the DSP in the demodulator 22 and the demodulator 13. If the reference clock is 80 MHz and the operational clock for the DSP is 40 MHz, the DSP clock 1H is obtained by dividing the reference clock by ½ in the frequency divider 92.

Figure 3:
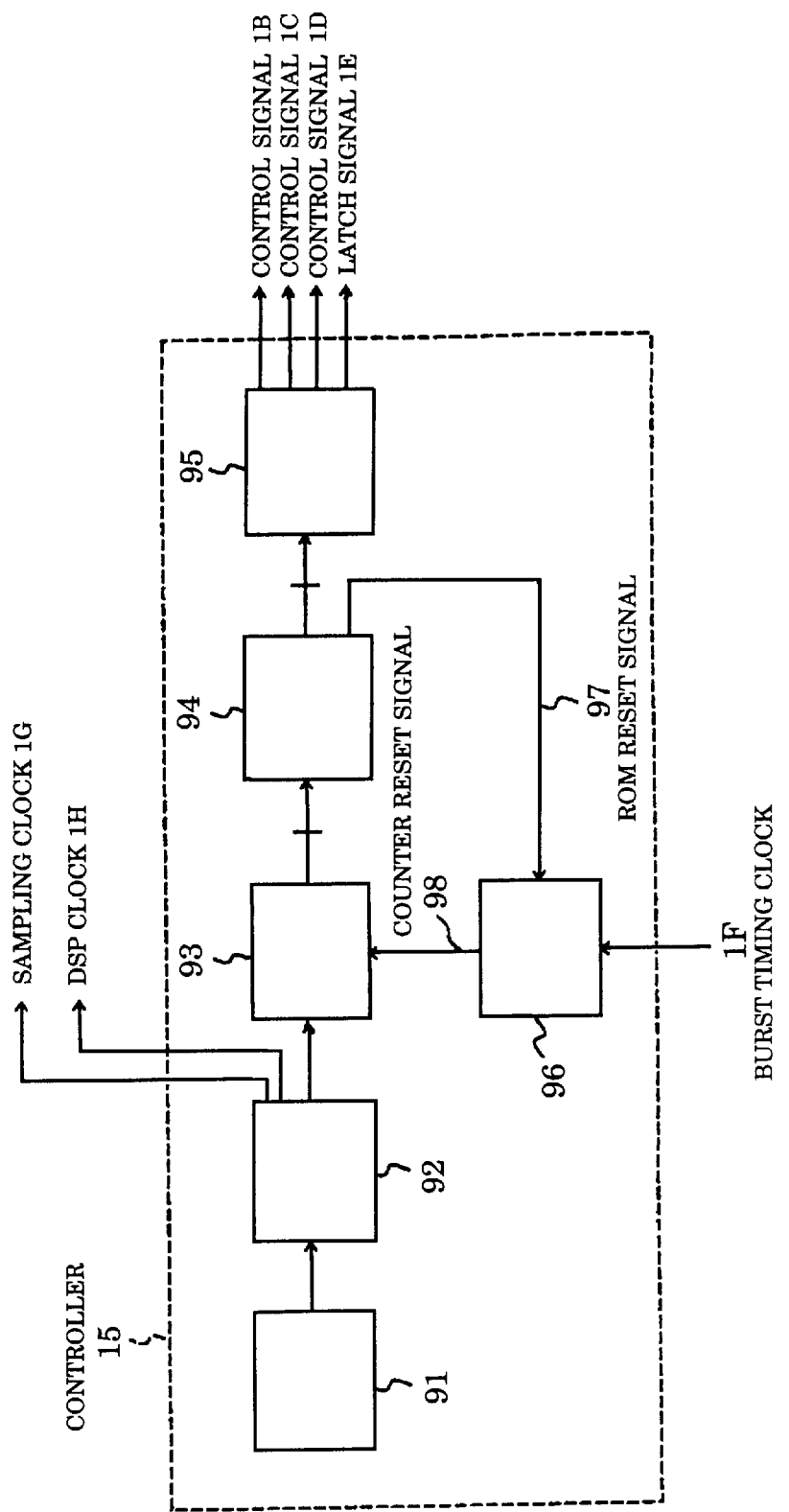
FIG. 3 is a block diagram showing an internal construction of the controller in the high-speed demodulating apparatus of burst data in FIG. 1.

Further, in FIG. 3, the counter clock is input to a counter 93, wherein it is divided in frequency to input to an address input of a ROM 94.

In order for the ROM 94 to function as a clock generator (hereinafter, referred to as CLK), signal patterns are in advance written therein. While receiving the address data from the counter 93 from the address 0 to a certain address repeatedly, the ROM 94 delivers a control signal.

The transmission rate of the CLK in this embodiment is designed to be 768 KHz/S, which is sufficiently higher than the transmission rate 384 KHz/S of the counter clock.

The count period in the counter 93 needs a time from when one demodulator receives a burst wave until it receives the subsequent burst wave. Two demodulators are provided to take in the burst waves alternately for each burst in this embodiment, and therefore, 10 msec suffices for the count period in the counter 93.

The output of the foregoing ROM 94 is sent out to a latch 95. The latch 95 latches the output from the ROM 94 to supply the control signal 1B, 1C, 1D, and latch signal 1E.

The control signal 1B, 1C are delivered to the demodulator 22, 13 in FIG. 1, respectively. The control signal 1D is delivered to a multiplexer (described later) in the output unit 14 in FIG. 1. The latch signal 1E is also delivered to a shift register (described later) in the output unit 14.

A reset circuit 96 receives the burst timing clock 1F from the demodulator 22 and a ROM reset signal 97 from the ROM 94, and outputs a counter reset signal 98 to the counter 93.

This counter reset signal 98 controls the count period in the counter 93.

Figure 4:
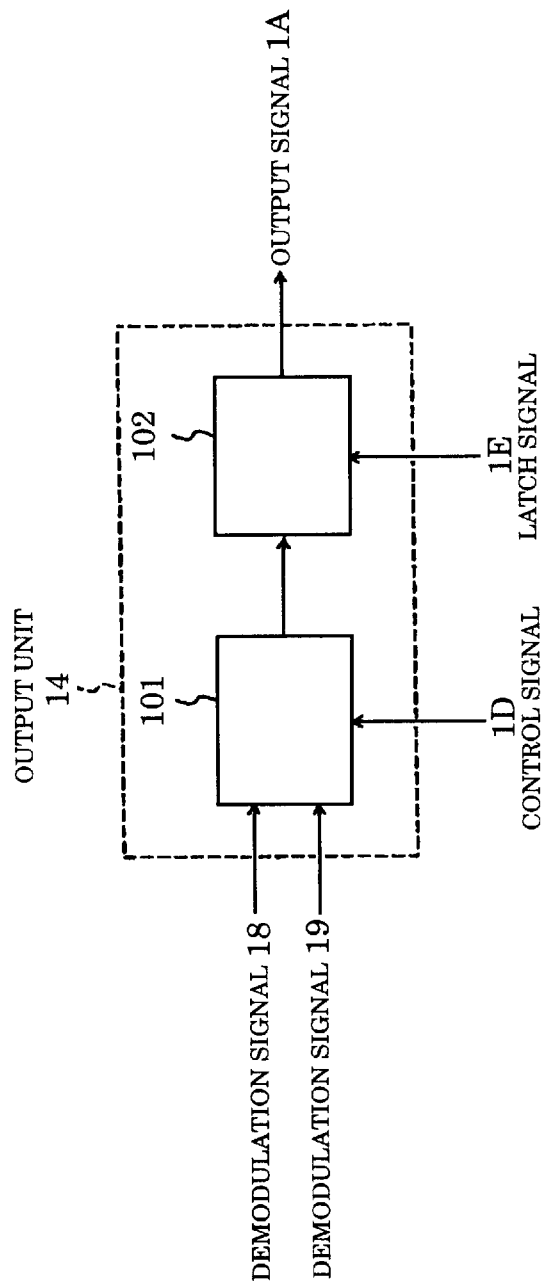
FIG. 4 is a block diagram showing an internal construction of the output unit in the high-speed demodulating apparatus of burst data in FIG. 1.

Next, the circuit construction of the foregoing output unit 14 will be described with reference to FIG. 4. As shown in FIG. 4, the output unit 14 is designed such that a multiplexer 101 and a shift register 102 are cascaded.

The multiplexer 101 receives the demodulation signal 18 from the demodulator 22 or the demodulation signal 19 from the demodulator 13 in FIG. 1 in accordance with the control signal 1D from the controller 15, and the foregoing two demodulation signals are multiplexed in the multiplexer 101.

The foregoing signals multiplexed in the multiplexer 101 are latched in the shift register 102 by the latch signal 1E from the controller 15, and the latched signals are supplied from the shift register 102 as the output signal 1A.

In this case, the demodulation signal is input to the shift register 102 in the form of a serial data to increase the processing speed of the DSP, and in the shift register, the serial data is converted into a parallel data to output the output signal 1A.

Figure 10:
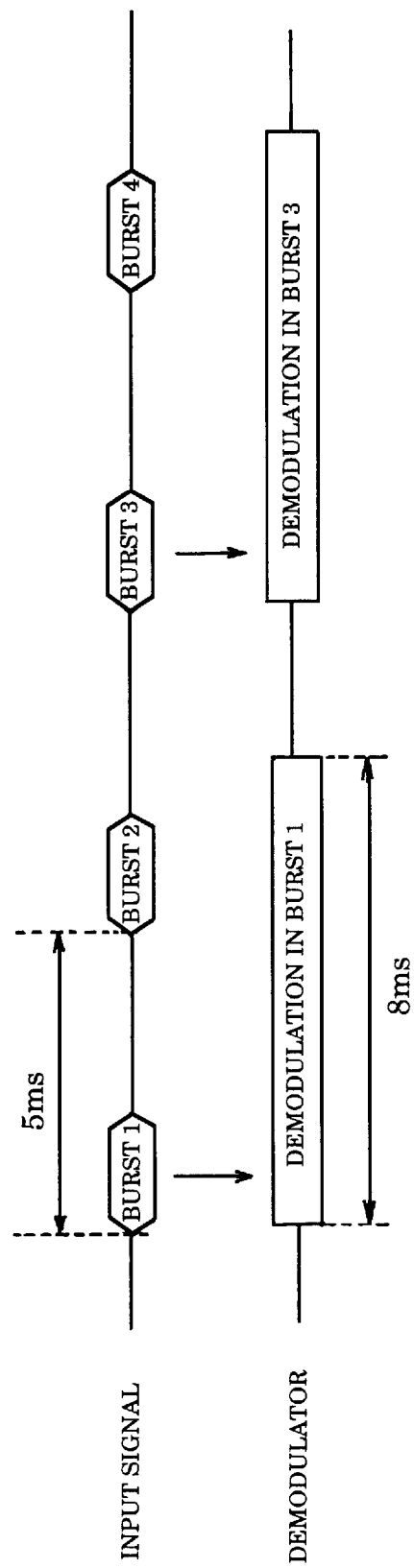
FIG. 10 is a timing chart for explaining a conventional demodulation method of burst data.

Next, the operation of the embodiment will be described with reference to timing charts in FIGS. 2(A) to 2(H). The PHS is also taken on as an example as described in FIG. 10.

Figure 2:
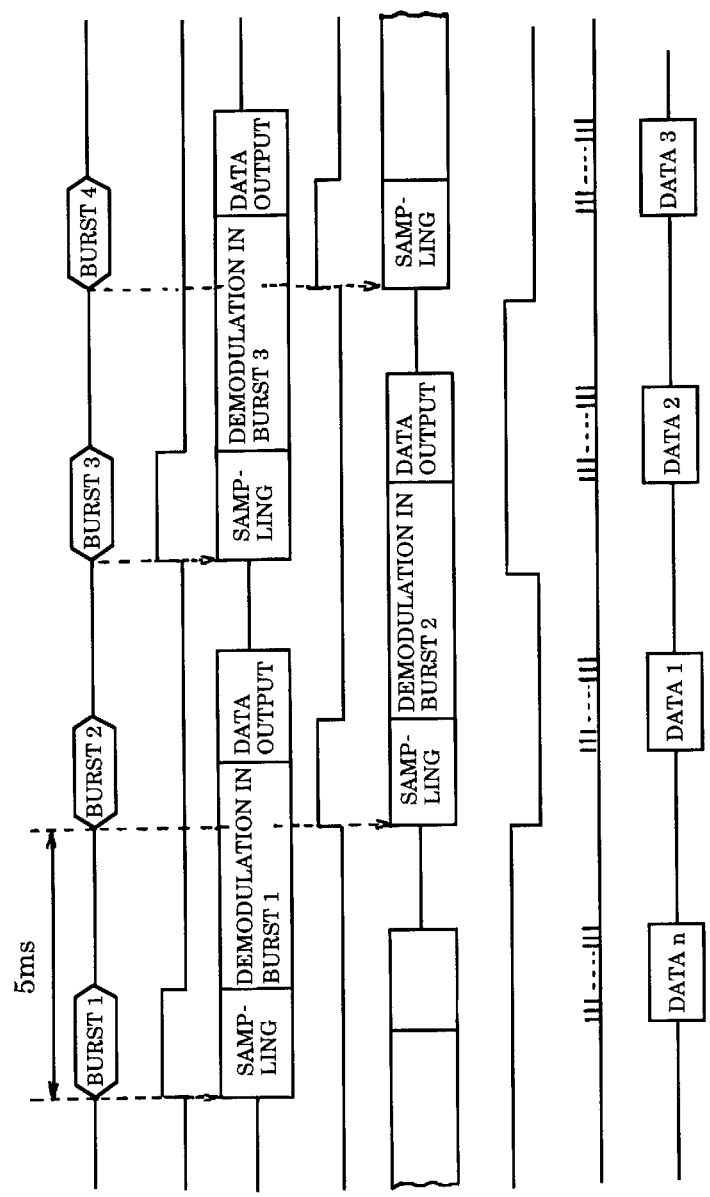
FIGS. 2(A) to 2(H) are timing charts for explaining the operation of the high-speed demodulating apparatus of burst data in FIG. 1.

A digitally modulated input signal 16 shown in FIG. 2(A) is input to the A/D converter in the input unit 21.

In the controller 15, the reference clock generated by the reference clock generator 91 shown in FIG. 3 is divided by the frequency divider 92, whereby the sampling clock 1G and the DSP clock 1H are produced. The sampling clock 1G is delivered to the A/D converter in the input unit 21. In the A/D converter in the input unit 21, the input signal is sampled by the sampling clock 1G and latched by the latch in the input unit 21.

Further in the controller 15, the counter 93 counts up the counter clock sent from the frequency divider 92 and divides the frequency, which is input to the address input in the ROM 94 as the address data.

When the address data is input to the ROM 94, the signal patterns stored in the ROM 94 in advance are read out sequentially from the address "0". Until a signal pattern of a specific address is read out, the ROM 94 receives the address data from the counter 93 repeatedly. Thereby, an output is delivered from the ROM 94 to the latch 95, and the output from the ROM 94 is latched in the latch 95.

The latch 95 latches the output from the ROM 94 and produces the control signal 1B shown in FIG. 2(B), the control signal 1C shown in FIG. 2(D), the control signal 1D shown in FIG. 2(F), and the latch signal 1E shown in FIG. 2(G).

The input signal 16 received at the A/D converter in the input unit 21 is a burst wave with the burst interval 5 ms as shown in FIG. 2(A), and the burst length is 0.625 ms.

The input signal 16 is latched by the latch in the input unit 21. A burst "1" shown in FIG. 2(A) is taken in into the demodulator 22 by the control signal 1B supplied by the controller 15, and the DSP clock 1H from the controller 15 is delivered to the DSP in the demodulator 22. The demodulation is executed by operating this DSP in the demodulator 22 as shown in FIG. 2(C), and the demodulated data, namely, the demodulation signal 18 is supplied to the output unit 14. Next, the demodulator 22 takes in a burst "3" shown in FIG. 2(A) in the same manner as in FIG. 10, and the demodulation is executed in the same manner.

A burst "2" shown in FIG. 2(A), which is not taken in during the foregoing process, is taken in into the demodulator 13 to execute the demodulation in the same manner as the demodulator 22. The modulation signal 17, namely, the burst "2" is taken in into the demodulator 13 by the control signal 1C output by the controller 15 shown in FIG. 2(D), and the demodulation is executed as shown in FIG. 2(E) and the demodulated data, namely, the demodulation signal 19 is supplied.

Thus, the alternate data capture and demodulation on the burst "1" or "2" are executed in the same manner except for the timing of the capture.

Accordingly, finishing the process of the burst "2", the demodulator 13 executes the process of a burst "4".

The demodulated signal, namely, the demodulation signal 18 or 19 is input to the output unit 14, and when the control signal 1D shown in FIG. 2(F) supplied by the controller 15 is in "H", the demodulation signal 18 is taken in into the multiplexer 101 in the output unit 14 by the control signal 1D and latched in the shift register 102 by the latch signal 1E shown in FIG. 2(G) supplied by the controller 15, thus producing the output signal 1A as shown in FIG. 2(H).

When the control signal 1D shown in FIG. 2(F) is in "L", the demodulation signal 19 supplied by the demodulator 13 is taken in into the multiplexer 101 by the control signal 1D and latched in the shift register 102 by the latch signal 1E, thus producing the output signal 1A as shown in FIG. 2(H).

Therefore, the output signal 1A from the output unit 14 contains in its final integrated form the data in which the whole burst data of the input signal 16 are demodulated.

As described above, according to the high-speed demodulating method of burst data of the invention, the input signal taken in into the input unit is sampled by the sampling clock from the controller to be taken out as the modulation signal. This modulation signal is taken in into the first demodulator or the second demodulator by the first control signal or the second control signal from the controller, respectively, to be demodulated therein. The first demodulation signal or the second demodulation signal is taken out of the first demodulator or the second demodulator by the third control signal from the controller to supply the output signal from the output unit. Accordingly, there is no loss of burst data in the demodulated data taken out of the output unit, thereby increasing the processing speed of demodulating burst data.

In addition, this method can execute the demodulation process with the identical hardware configuration, without being restricted by the modulation system or the transmission rate. Further, the additional elements which make up the demodulator do not require a new software design and the processing speed is not subject to the requirements of the DSP in theory.

According to the high-speed demodulating apparatus of burst data of the invention, the input signal digitally modulated is taken in into the input unit and sampled by the sampling clock from the controller to be taken out as the modulation signal. This modulation signal is taken in for each burst into the first demodulator or the second demodulator by the first or the second control signal from the controller, respectively, to be demodulated therein. The demodulation signal is taken out of the first demodulator or the second demodulator by the third control signal from the controller to supply the output signal. Accordingly, this apparatus can increase the processing speed of the demodulation with the identical hardware configuration, without being restricted by the modulation system or the transmission rate. Further, the apparatus does not require new software even though the demodulator needs more elements, and is not subject to the elements utilized to compose the demodulator.

Although a particular preferred embodiment of the invention has been disclosed in detail for illustrative purposes, it will be recognized that variations or modifications of the disclosed apparatus, including the rearrangement of parts, lie within the scope of the present invention.

What is claimed is:

1. A high-speed demodulating method of burst data, wherein:

a digitally modulated input signal is taken into an input unit and sampled therein by a sampling clock from a controller, whereby a modulation signal is supplied therefrom;

the modulation signal is taken into a first demodulator or a second demodulator by a first control signal or a second control signal from the controller, respectively, and a first demodulation signal or a second demodulation signal is produced in the first or the second demodulator, respectively; and an output signal is taken out of the first demodulation signal or the second demodulation signal by a third control signal from the controller.

2. A high-speed demodulating apparatus of burst data, comprising:

an input unit for taking in a digitally modulated input signal and supplying a modulation signal sampled by a sampling clock from a controller;

a first demodulator and a second demodulator for taking in the modulation signal by a first control signal or a second control signal from the controller, respectively, and supplying a first demodulation signal or a second demodulation signal, respectively; and an output unit for receiving the first demodulation signal or the second demodulation signal and supplying an output signal by a third control signal.

3. A high-speed demodulating apparatus of burst data as claimed in claim 2, wherein the controller comprises:

a reference clock generator for generating a reference clock;

a frequency divider for dividing a frequency of the reference clock to produce the sampling clock, a DSP clock, and a counter clock;

a counter for counting the counter clock and dividing a frequency thereof to supply an address data;

a ROM for receiving the address data and reading out signal patterns written therein in advance to supply a control signal;

a latch for latching an output signal from the ROM to produce the first through the third control signals and a latch signal; and a reset circuit for receiving a burst timing clock from the first demodulator and a ROM reset signal from the ROM and supplying a counter reset signal to reset the counter.

4. A high-speed demodulating apparatus of burst data as claimed in claim 2, wherein the output unit comprises:

a multiplexer for multiplexing the first demodulation signal supplied from the first demodulator by the third control signal and the second demodulation signal supplied from the second demodulator by the third control signal; and a shift register for latching an output signal from the multiplexer by a latch signal and supplying the output signal from the shift register.

* * * * *